United States Patent [19]

Higashizono et al.

[11] Patent Number: 5,238,873
[45] Date of Patent: Aug. 24, 1993

[54] METHOD FOR MANUFACTURING SEMICONDUCTOR DEVICE HAVING A METALLIC SILICIDE LAYER

[75] Inventors: Masayoshi Higashizono, Kawasaki; Yasunobu Kodaira, Tokyo; Katsuya Shino, Yokohama, all of Japan

[73] Assignee: Kabushiki Kaisha Toshiba, Kawasaki, Japan

[21] Appl. No.: 769,785

[22] Filed: Oct. 2, 1991

[30] Foreign Application Priority Data

Oct. 2, 1990 [JP] Japan .................................. 2-264874

[51] Int. Cl.⁵ ......................................... H01L 21/441
[52] U.S. Cl. ..................................... 437/193; 437/200
[58] Field of Search .............................. 437/193, 200; 148/DIG. 122, DIG. 147

[56] References Cited

U.S. PATENT DOCUMENTS

| | | | |
|---|---|---|---|
| 4,816,425 | 3/1989 | McPherson | 437/193 X |
| 4,935,380 | 6/1990 | Okumura | 437/193 X |
| 4,978,637 | 12/1990 | Liou et al. | 437/193 |
| 5,059,554 | 10/1991 | Spinner et al. | 437/193 |

FOREIGN PATENT DOCUMENTS 0067921  3/1989  Japan .................................. 437/200

Primary Examiner—John S. Maples
Attorney, Agent, or Firm—Foley & Lardner

[57] ABSTRACT

A method for manufacturing a semiconductor device, comprising the steps of forming an oxide film selectively on the surface of a semiconductor substrate; forming a first polycrystalline silicon film on the whole surface and then forming a metallic silicide film on the surface of the first polycrystalline silicon film; patterning the first polycrystalline silicon film and the metallic silicide film except for the desired areas by a lithographic method; depositing polycrystalline silicon on the whole surface to thereby form a second polycrystalline silicon film and allow it to cover the patterned first polycrystalline silicon film and metallic silicide film; and performing oxidation in a state in which a boundary portion between the first polycrystalline silicon film and the metallic silicide film is not exposed to an oxidizing atmosphere by the presence of the second polycrystalline silicon film, to form an oxide film on the surface.

4 Claims, 3 Drawing Sheets

METHOD FOR MANUFACTURING SEMICONDUCTOR DEVICE HAVING A METALLIC SILICIDE LAYER

BACKGROUND OF THE INVENTION

The present invention relates to a method for manufacturing a semiconductor device, and in particular, a manufacturing method using a metallic silicide in forming transistors, wiring layers and contact holes.

Recently there has been adopted a method wherein a metallic silicide is used in forming transistors, wiring layers and contact holes, to greatly reduce resistance and attain faster operation. The conventional manufacturing method will be described below with reference to FIGS. 1a-1c which shows a vertical section of elements process by process.

At the surface of a p-type semiconductor substrate 1, a field oxide film 2 is formed between in a region II for forming a MOS transistor and a region III for contact with the semiconductor substrate 1, or in a wiring region I, and thereafter an oxide film is formed throughout the whole. The portion of the oxide film corresponding to the region III for contact with the substrate is removed by wet etching, and the oxide film remains as a gate oxide film 3 on the surface of the MOS transistor forming region II. A polycrystalline silicon film 4 and a metallic silicide film 5 are formed successively on the whole surface, and then resist is applied onto the surface of the metallic silicide film 5 to form patterned resist films 6a, 6b and 6c (FIG. 1a).

Etching is performed with the resist films 6a, 6b and 6c as masks, and the polycrystalline silicon film 4. The metallic silicide film 5 is patterned as shown in FIG. 1b, whereby polycrystalline silicon films 4a, 4b, 4c and metallic silicide films 5a, 5b, 5c are formed in the wiring region I, MOS transistor region II and substrate contact region III.

Oxide films 7 are formed to cover the thus-formed polycrystalline silicon films 4a, 4b, 4c and metallic silicide films 5a, 5b, 5c (FIG. 3c). Thereafter, a wiring layer, a MOS transistor and a contact hole are formed, although these are not shown.

When the oxide films 7 are formed in the conventional method, however, the interfaces of the polycrystalline silicon films 4a, 4b, 4c and the metallic silicide films 5a, 5b, 5c are exposed to an oxidizing atmosphere, thereby causing bird's beaks 8. Once the bird's beaks 8 are formed, the polycrystalline silicon films and the metallic silicide films are separated from each other, deteriorating the production yield and reliability.

SUMMARY OF THE INVENTION

Accordingly, it is the object of the present invention to provide a semiconductor device manufacturing method capable of preventing the formation of bird's beaks and attaining an improvement in production yield and reliability.

According to the present invention, there is provided a semiconductor device manufacturing method including the steps of forming an oxide film selectively on the surface of a semiconductor substrate; forming a first polycrystalline silicon film on the whole surface and forming a metallic silicide film on the surface of the first polycrystalline silicon film; patterning the first polycrystalline silicon film and the metallic silicide film while allowing desired regions to remain by a lithographic method; depositing a polycrystalline silicon throughout the whole surface, thereby forming a second polycrystalline silicon film and allowing it to cover the patterned first polycrystalline silicon film and metallic silicide film; and performing oxidation in a state in which a boundary portion between the first polycrystalline silicon film and the metallic silicide film is prevented from being exposed to an oxidizing atmosphere by the presence of the second polycrystalline film, to form an oxide film on the surface.

If the first polycrystalline silicon film and the metallic silicide film are formed, and, then patterned and thereafter, an oxide film is formed directly thereon, the boundary portion between the first polycrystalline silicon film and the metallic silicide film is exposed to an oxidizing atmosphere, thus resulting in the formation of bird's beaks and interface separation. But this can be avoided by covering the boundary portion with the second polycrystalline silicon film and forming an oxide film in a state in which the boundary portion is not exposed to an oxidizing atmosphere.

After the formation of the second polycrystalline silicon film, the portion other than the portion thereof formed on the sidewalls of the first polycrystalline silicon film and the metallic silicide film may be removed. Also in this case, the formation of bird's beaks is prevented because the boundary portion is covered by the sidewalls and is therefore not exposed to an oxidizing atmosphere. In this case, moreover, since an oxide film is formed after removal of the other portion of the second polycrystalline silicon film than the sidewall portion thereof, it is possible to control the thickness of the oxide film to a high accuracy. As a result, for example, it is possible to minimize variations in the injection depth at the time of injecting impurity ions.

DESCRIPTION OF THE PREFERRED EMBODIMENTS

Figure 1A:
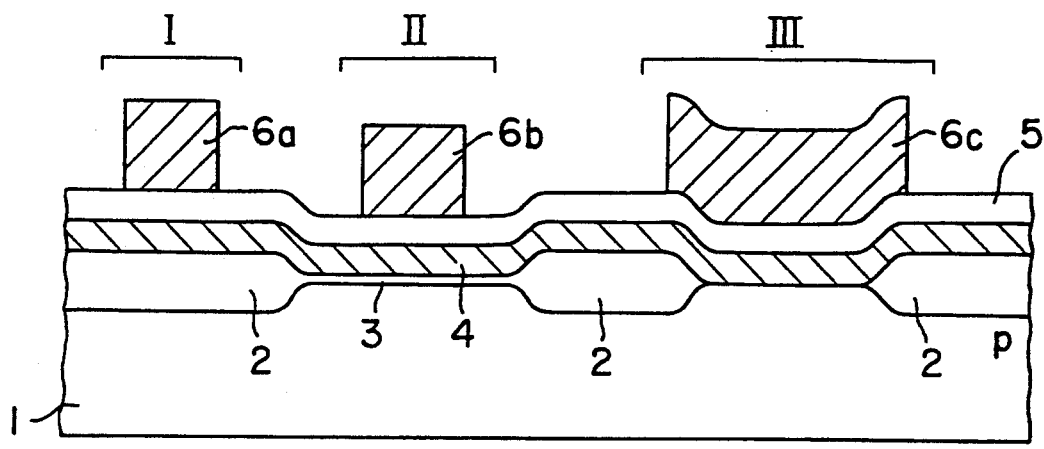
FIG. 1a-1c sectional views of a conventional semiconductor device manufacturing method process by process.
Figure 1B:
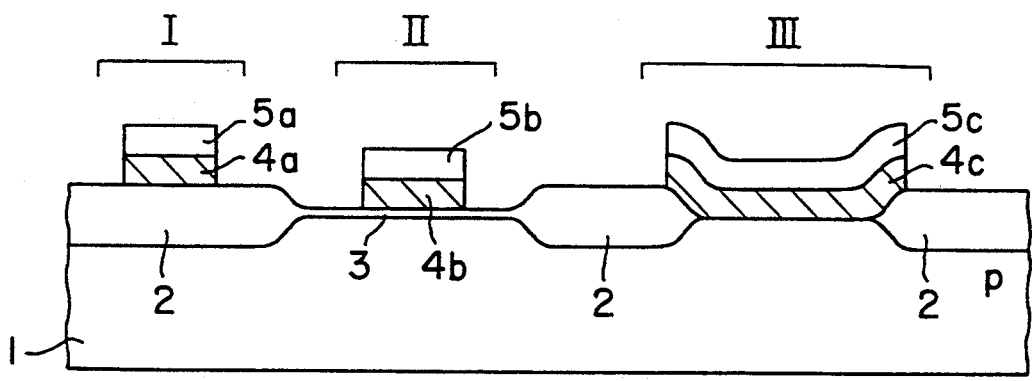
Figure 1C:
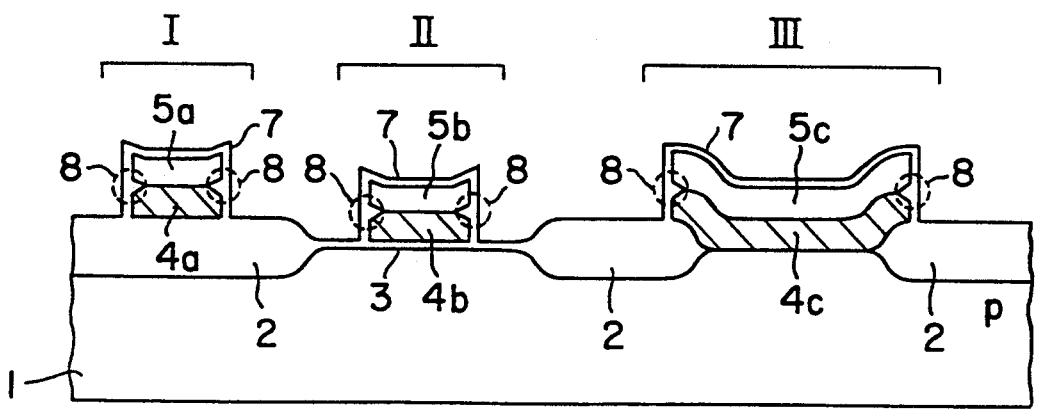
Figure 2A:
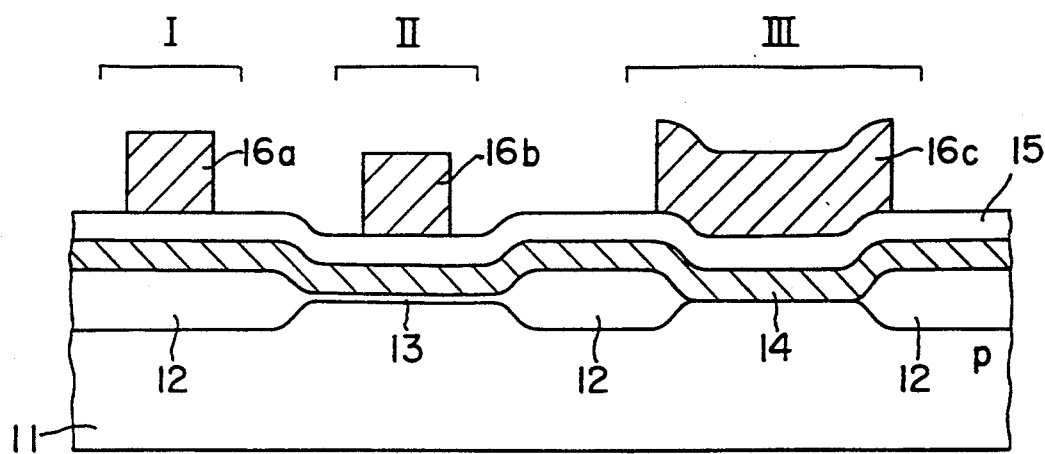
FIG. 2a-2c sectional views of a semiconductor device manufacturing method according to an embodiment of the present invention process by process.

An embodiment of the present invention will now be described with reference to FIG. 2, which illustrates a semiconductor device manufacturing method of this embodiment process by process. Field oxide films 12 are formed on the surface of a semiconductor substrate 11 of, say, the p-type, and element isolation is made. Then, in an oxidizing atmosphere held at about 900° C. there is formed an oxide film 13 throughout the whole surface at a film thickness of 200 Å according to a thermal oxidation method. The portion of this oxide film formed in a region III for contact with the substrate is removed by wet etching and a gate oxide film 13 is formed in a MOS transistor forming region II. Thereafter, a polycrystalline silicon is deposited on the whole surface at a thickness of 2000 Å by a CVD method to form a polycrystalline silicon film 14. Furthermore, a metallic silicide is deposited on the whole surface of the polycrystalline silicon film 14 at a thickness of 2000 Å by sputtering to form a metallic silicide film 15. Then, resist is applied to the whole surface by lithography, followed by patterning, to form resist films 16a, 16b and 16c (FIG. 2a).

Figure 2B:
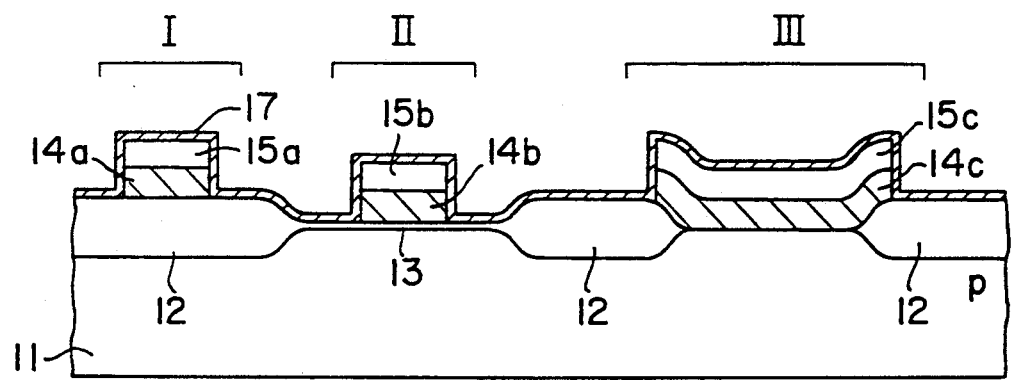

With the resist films 16a, 16b and 16c as masks, the polycrystalline silicon film 14 and the metallic silicide film 15 are patterned by reactive ion etching to form polycrystalline silicon films 14a, 14b, 14c and metallic silicide films 15a, 15b, 15c. Thereafter, unlike the prior art, a polycrystalline silicon film 17 is formed throughout the whole surface (FIG. 2b). The polycrystalline silicon film 17 is formed at a thickness of about 500 Å by a CVD method.

Figure 2C:
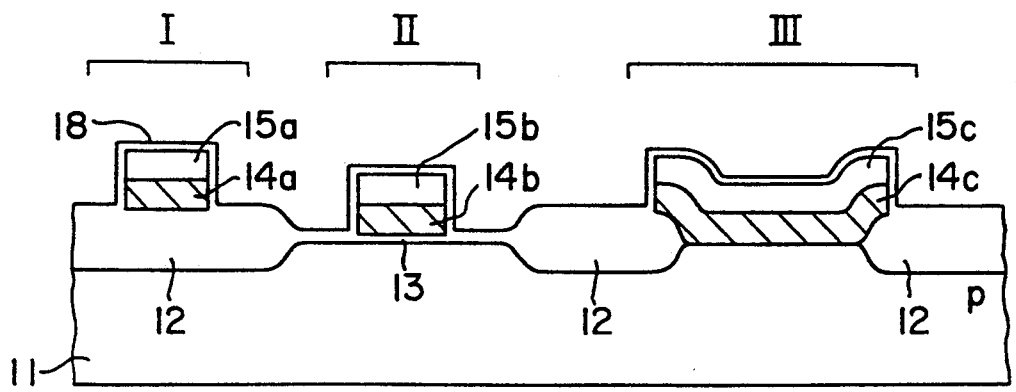

The polycrystalline silicon film 17 is then oxidized in an oxidizing atmosphere held at about 900° C. by a thermal oxidation method to form an oxide film 18 having a thickness of about 1000 Å (FIG. 2c). Thereafter, in each of the regions I, II and III there are formed a wiring layer, a MOS transistor, and a hole for contact with the substrate.

Thus, in this embodiment, when the polycrystalline silicon films 14a, 14b, 14c and the metallic silicide films 15a, 15b, 15c are formed, the whole is covered with the polycrystalline silicon film 17 and then oxidation is made to form the oxide film 18. Therefore, the oxidation is performed in a state in which the boundary between the polycrystalline silicon film and the metallic silicide film is protected by the polycrystalline silicon film 17 and is not exposed to the oxidizing atmosphere, whereby the formation of birds' beaks is prevented. As a result, the separation of the metallic silicide film is prevented and there is an improvement in production yield and reliability.

Figure 3A:
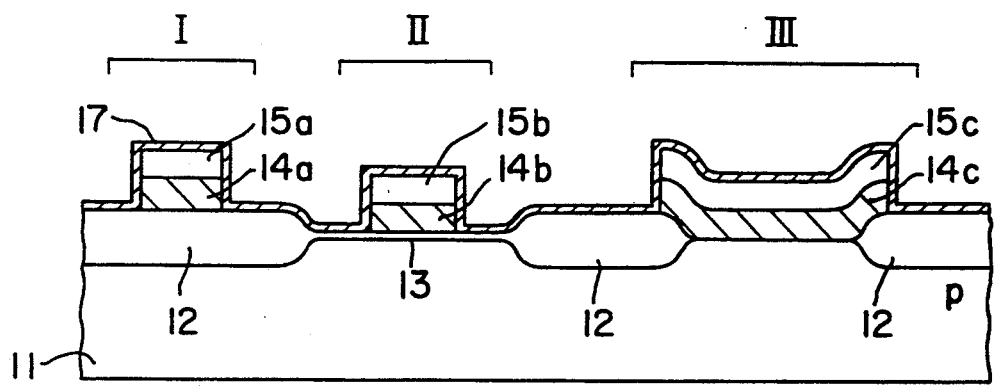
FIG. 3a-3c sectional views of a semiconductor device manufacturing method according to another embodiment of the present invention process by process.

A semiconductor device manufacturing method according to another embodiment of the present invention will now be described. Like the previous embodiment, polycrystalline silicon films 14a, 14b, 14c and metallic silicide films 15a, 15b, 15c are formed, and a polycrystalline silicon film 17 is formed on the whole surface (FIG. 3a).

Figure 3B:
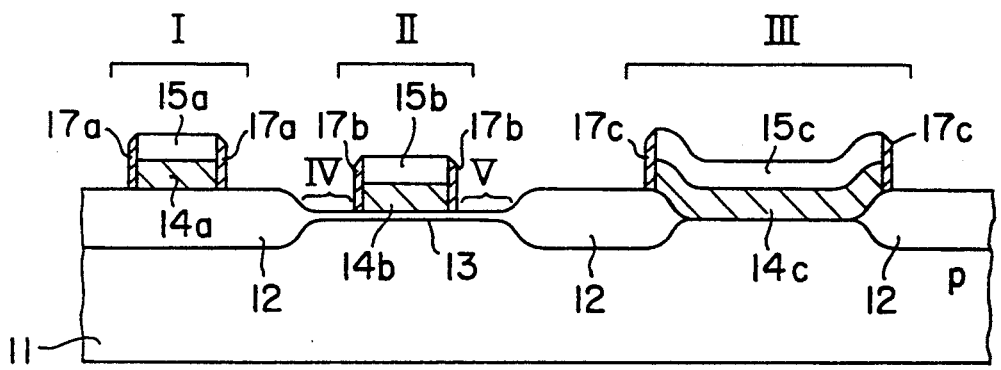

Thereafter, the polycrystalline silicon film 17 is subjected to anisotropic etching except portions 17a, 17b and 17c thereof corresponding to said sidewalls of the polycrystalline silicon films 14a, 14b, 14c and the metallic silicide films 15a, 15b, 15c (FIG. 3b).

Figure 3C:
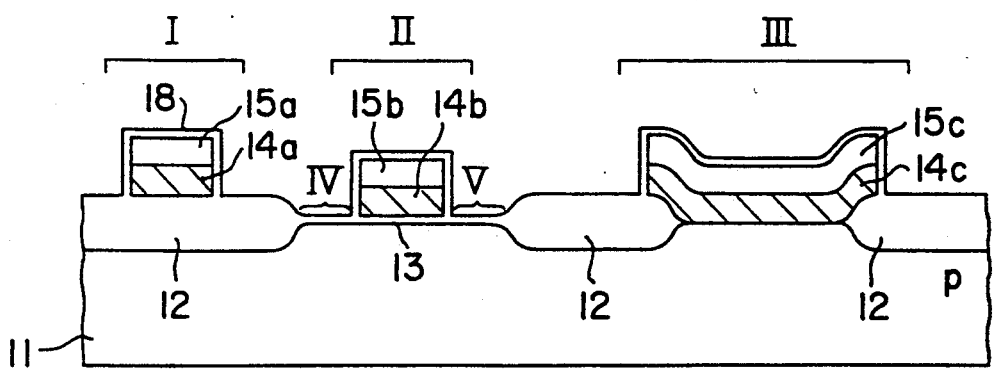

Oxidation is performed in an oxidizing atmosphere held at about 900° C. by a thermal oxidation method to form an oxide film 18 having a thickness of about 1000 Å (FIG. 3c). Then, a wiring layer, a MOS transistor and a hole for contact with the substrate are formed in each of the regions I, II and III.

Also in this embodiment, the formation of the oxide film 18 is performed in a state in which the interfaces between the polycrystalline silicon films 14a, 14b, 14c and the metallic silicide films 15a, 15b, 15c are protected by the polycrystalline silicon films 17a, 17b and 17c and so are not exposed to the oxidizing atmosphere, resulting in the formation of bird's beaks being prevented.

In this embodiment, moreover, the portion of the polycrystalline silicon film 17 (FIG. 3a) other than the sidewalls 17a, 17b and 17c is removed. Therefore, as shown in FIG. 3b, the polycrystalline silicon film portions on the surfaces of source and drain regions IV, V in the MOS transistor forming region II are also removed. In this state, the oxide film 18 is newly formed, so it is possible to control the thickness of the oxide film 18 to a high accuracy, as shown in FIG. 3c. Therefore, it is easy to control the injection depth at the time of injecting impurity ions into the source and drain regions IV, V and it is possible to improve the characteristics and to control variations.

All the above embodiments are mere examples, not restricting the present invention. For example, no limitation is made on the kind of elements to be formed, and the invention is applicable to the manufacture of a semiconductor device using a metallic silicide.

What is claimed is:

1. A method for manufacturing a semiconductor device, comprising the steps of:
   forming an oxide film selectively on the surface of a semiconductor substrate;
   forming a first polycrystalline silicon film on the whole surface and then forming a metallic silicide film on the surface of said first polycrystalline silicon film;
   patterning said first polycrystalline silicon film and said metallic silicide film except for desired areas by a lithographic method;
   depositing polycrystalline silicon on the whole surface, thereby forming a second polycrystalline silicon film and allowing it to cover the patterned first polycrystalline silicon film and metallic silicide film; and
   performing oxidation in a state in which a boundary portion between said first polycrystalline silicon film and said metallic silicide film is not exposed to an oxidizing atmosphere by the presence of said second polycrystalline silicon film, to form an oxide film on the surface.

2. A method for manufacturing a semiconductor device, comprising the steps of:
   forming an oxide film selectively on the surface of a semiconductor substrate;
   forming a first polycrystalline silicon film on the whole surface and then forming a metallic silicide film on the surface of said first polycrystalline silicon film;
   patterning said first polycrystalline silicon film and said metallic silicide film except for desired areas by a lithographic method;
   depositing polycrystalline silicon on the whole surface, thereby forming a second polycrystalline silicon film and allowing it to cover the patterned first polycrystalline silicon film and metallic silicide film;
   removing the portion of said second polycrystalline silicon film other than the portion thereof formed on side faces of said first polycrystalline silicon film and said metallic silicide film by anisotropic etching to form sidewalls; and
   performing oxidation in a state in which a boundary portion between said first polycrystalline silicon film and said metallic silicide film is not exposed to an oxidizing atmosphere by the presence of said sidewalls, to form an oxide film on the surface.

3. The method according to claim 1, wherein said second polycrystalline silicon film is turned to an oxide film by oxidation.

4. The method according to claim 2, wherein said sidewalls are turned to an oxide film by oxidation.

* * * * *